(12) United States Patent
Yang et al.

(10) Patent No.: US 11,699,685 B2
(45) Date of Patent: Jul. 11, 2023

(54) NON-CURE AND CURE HYBRID FILM-ON-DIE FOR EMBEDDED CONTROLLER DIE

(71) Applicant: Western Digital Technologies, Inc., San Jose, CA (US)

(72) Inventors: Ling Yang, Shanghai (CN); Hui Xu, Shanghai (CN); Chong Un Tan, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 168 days.

(21) Appl. No.: 17/375,296

(22) Filed: Jul. 14, 2021

(65) Prior Publication Data
US 2023/0020021 A1    Jan. 19, 2023

(51) Int. Cl.
*H01L 25/065* (2023.01)
*H01L 23/00* (2006.01)

(52) U.S. Cl.
CPC .......... *H01L 25/0657* (2013.01); *H01L 24/27* (2013.01); *H01L 24/32* (2013.01); *H01L 24/48* (2013.01); *H01L 24/73* (2013.01); *H01L 2224/27515* (2013.01); *H01L 2224/3201* (2013.01); *H01L 2224/32145* (2013.01); *H01L 2224/48225* (2013.01); *H01L 2224/73215* (2013.01); *H01L 2924/1438* (2013.01)

(58) Field of Classification Search
CPC ......... H01L 24/27; H01L 24/32; H01L 24/48; H01L 24/73; H01L 2224/27515; H01L 2224/3201; H01L 2224/32145; H01L 2224/48225

See application file for complete search history.

(56) References Cited

U.S. PATENT DOCUMENTS

| | | | |
|---|---|---|---|
| 6,326,234 B1 | 12/2001 | Nakamura | |
| 2020/0020669 A1* | 1/2020 | Uchida | H01L 23/28 |
| 2021/0407965 A1* | 12/2021 | Kim | H01L 25/50 |

FOREIGN PATENT DOCUMENTS

KR         101751972 B1       8/2017

* cited by examiner

*Primary Examiner* — Jasmine J Clark
(74) *Attorney, Agent, or Firm* — Morgan, Lewis & Bockius LLP

(57) ABSTRACT

A semiconductor assembly includes a first die and a second die. The semiconductor assembly also includes a film on die (FOD) layer configured to attach the first die to the second die. The FOD layer is disposed on a first surface of the first die. The FOD layer includes a first portion comprising a first die attach film (DAF) disposed on an inner region of the first surface. The FOD layer also includes a second portion that includes a second DAF disposed on a peripheral region of the first surface surrounding the inner region. The second DAF includes a different material than the first DAF.

20 Claims, 4 Drawing Sheets

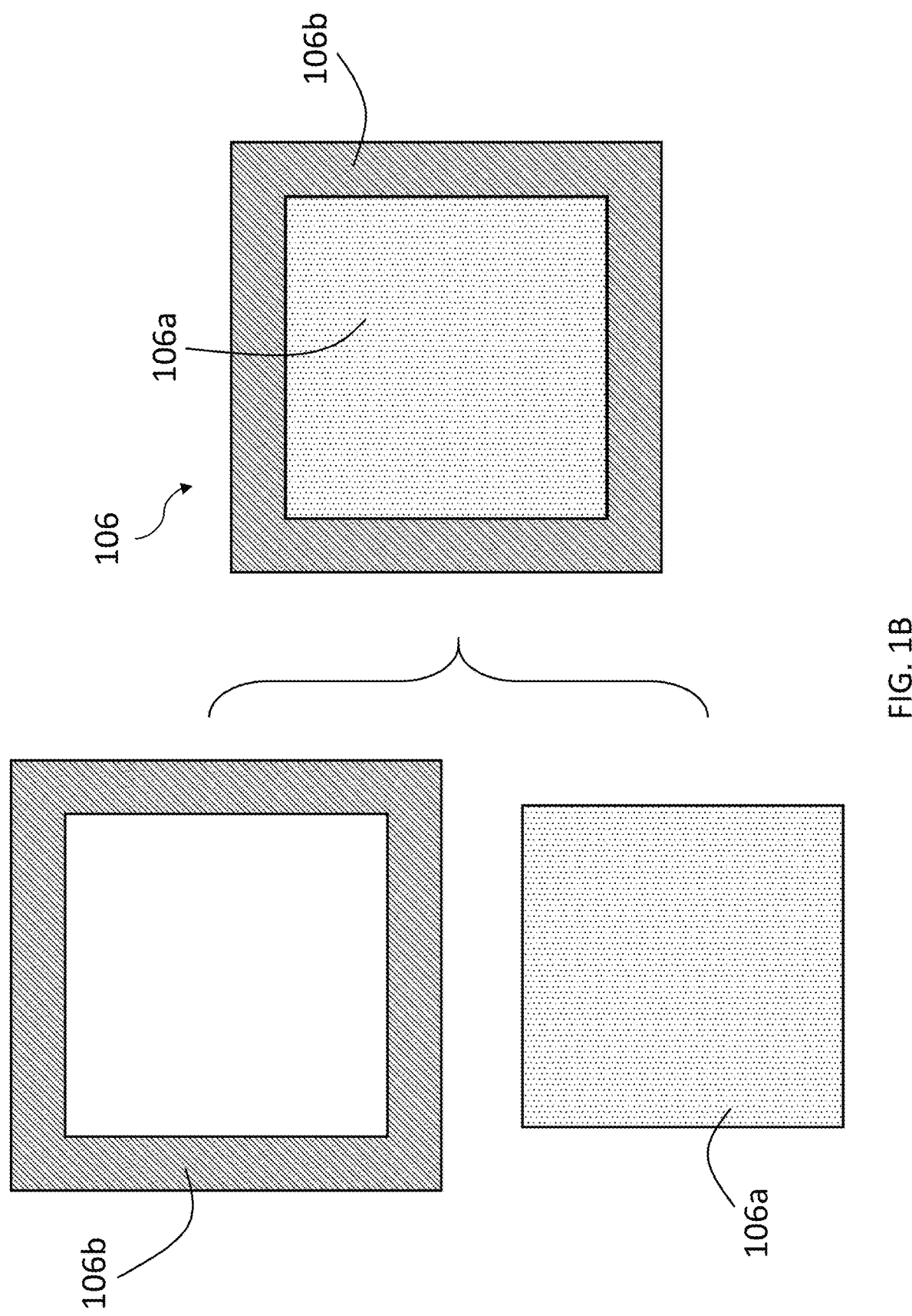

NON-CURE AND CURE HYBRID FILM-ON-DIE FOR EMBEDDED CONTROLLER DIE

BACKGROUND

The present disclosure generally relates to packaging for semiconductor memory devices (e.g., NAND flash devices) and manufacture thereof and, more particularly, to a semiconductor package having a film-on-die (FOD) layer for an embedded controller die.

FOD for embedded controller structures can provide package minimization as well as better transition performance compared with side by side structures. However, traditional FOD methods suffer from certain issues. Traditional FOD are made from a uniform die attach film (DAF). For example, a typical FOD may be composed of either a single non-cure type DAF or a single cure-type DAF. If using a non-cure type DAF, the flowability of the DAF material may be poor, and voids and delamination may easily occur. If using a cure-type DAF, DAF bleeding and die bowing may occur although the flowability may be improved. The reason for die bowing is that the stress introduced by unbalanced structure design is combined with the flowability of the DAF material. During die attachment, the controller die and wire area may be higher than other areas if the controller die cannot be totally embedded into the FOD. Moreover, the DAF material in the controller area may be pushed to edge areas and bleed out. As a result, bleeding and die bowing may occur.

Therefore, there is a need to avoid bleeding and die bowing during die attachment.

SUMMARY

In one embodiment there is a semiconductor assembly. The semiconductor assembly includes a first die and a second die. The semiconductor assembly also includes a FOD layer configured to attach the first die to the second die. The FOD layer is disposed on a first surface of the first die. The FOD layer includes a first portion comprising a first DAF disposed on an inner region of the first surface. The FOD layer also includes a second portion that includes a second DAF disposed on a peripheral region of the first surface surrounding the inner region. The second DAF includes a different material than the first DAF.

In some embodiments, the peripheral region extends from the inner region to one or more edges of the first surface. In some embodiments, the FOD layer does not extend beyond the edges of the first surface. In some embodiments, the first DAF includes a cured DAF, and the second DAF includes a non-cured DAF. In some embodiments, the second die is embedded in the first portion of the FOD layer. In some embodiments, the second die is mounted on a substrate, wherein the second die and the FOD layer are disposed between the substrate and the first die, and wherein the first die and the second die are electrically connected to the substrate. In some embodiments, the semiconductor assembly further includes one or more bond wires embedded in the first portion of the FOD layer, the one or more bond wires electrically connecting the second die to the substrate. In some embodiments, the first die is a memory die and the second die is a controller die. In some embodiments, the memory die is a NAND die.

In another embodiment a method for manufacturing a FOD is provided. The method includes forming a first portion of the FOD using a first mask, wherein the first portion includes a first type of die attach film (DAF), the first mask indicating a size and shape of the first portion. The method also includes forming a second portion of the FOD using a second mask, wherein the second portion includes a second type of DAF, the second mask indicating a size and shape of the second portion. The method further includes assembling the first portion and the second portion to form the FOD, such that the first portion is surrounded by the second portion.

In some embodiments of the method, the first type of DAF includes a cure type of DAF, and the second type of DAF includes a non-cure type of DAF. In some embodiments of the method, the first type of DAF does not include a non-cure type of DAF, and the second type of DAF does not include a cure type of DAF. In some embodiments of the method, forming the first portion of the FOD includes forming the first portion of the FOD on a liner, and forming the second portion of the FOD includes forming the second portion of the FOD on another liner. In some embodiments, the method further includes attaching a dicing tape to a top or bottom surface of the FOD. In some embodiments of the method, the first portion is a central portion of the FOD surrounded by the second portion. In some embodiments of the method, the first portion has a square or rectangular shape.

In another embodiment there is a semiconductor assembly. The semiconductor assembly includes a first die means for storing data, a second die means for controlling the first die means. The semiconductor assembly also includes a film means for attaching the first die means to the second die means. The second die means is embedded in the film means. The film means includes a first portion and a second portion. The first portion includes a first type of DAF, and the second portion includes a second type of DAF. The first portion is surrounded by the second portion. In some embodiments, the first portion is a central portion of the film means surrounded by the second portion. In some embodiments, the first type of DAF includes a cure type of DAF, and the second type of DAF includes a non-cure type of DAF. In some embodiments, the first type of DAF does not include a non-cure type of DAF, and the second type of DAF dost not include a cure type of DAF.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings:

FIG. 1B is a top view of a FOD layer for the semiconductor assembly of FIG. 1A;

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
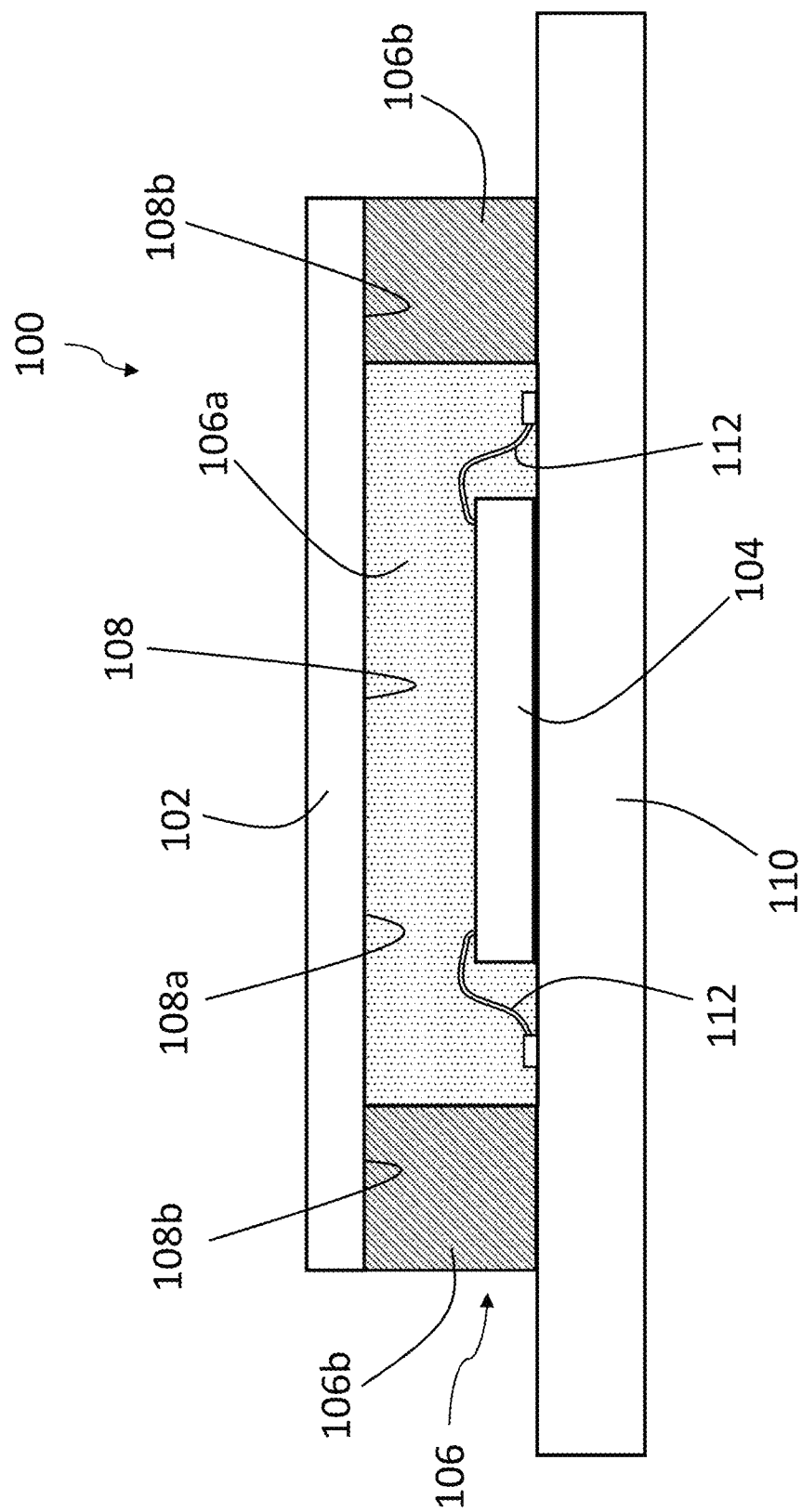
FIG. 1A is a partial cross-sectional view of a semiconductor assembly according to some embodiments.

Referring to FIG. 1A, there is shown a semiconductor assembly 100, in accordance with an exemplary embodiment of the present disclosure. In some embodiments, the semiconductor assembly 100 includes a first die 102 and a second die 104. In some embodiments, the first die 102 may be a memory die configured to store data (e.g., a NAND die), and the second die 104 may be a controller die. Second die 104, for example, may be a controller die configured to control the operation of first die 102. In some embodiments, semiconductor assembly 100 may include one or more additional dies (not shown), for example, additional NAND dies. These additional dies (not shown) may be, for example, stacked on first die 102 and electrically connected to first die 102 via bond wires.

In some embodiments, the semiconductor assembly 100 also includes a FOD layer 106 configured to attach the first die 102 to the second die 104. The FOD layer 106 may be disposed on a first surface 108 of the first die 102. In some embodiments, the FOD layer 106 may include a first portion 106a, which includes a first DAF disposed on an inner region 108a of the first surface 108. The FOD layer 106 may also include a second portion 106b, which includes a second DAF disposed on a peripheral region 108b of the first surface 108. The peripheral region 108b may surround the inner region 108a. In some embodiments, the peripheral region 108b may extend from the inner region 108a to one or more edges of the first surface 108. In some embodiments, the peripheral region 108b extends from the inner region 108a to all of the edges of the first surface 108. In some embodiments, the FOD layer 106 does not extend beyond the edges of the first surface 108. In some embodiments, the size (e.g., footprint) of FOD layer 106 may be the same as or less than the size of first die 102.

In some embodiments, the second DAF may include a different material than the first DAF. For example, the first DAF may include a cured DAF, and the second DAF may include a non-cured DAF. In some embodiments, the first DAF does not include a non-cure type of DAF but only includes a cure type of DAF, and the second DAF dost not include a cure type of DAF but only includes a non-cure type of DAF. In some embodiments, the cure type DAF may have an initial liquid or flowable state and can be hardened to a solid state by a curing process. In some embodiments, the non-cure type DAF may obtain a substantially solid state without a curing process. For example, in some embodiments, a cure type DAF may include mostly epoxy or phenol type cross-linking resins that can provide good flowability. On the other hand, a non-cure type of DAF may include mostly acrylic and/or other rubber resins that can provide good mechanical properties and no bleeding.

In some embodiments, the second die 104 is embedded in the first portion 106a of the FOD layer 106. In some embodiments, the second die 104 is mounted on a substrate 110. Substrate 110 may be, for example, a printed circuit board (PCB) having conductive traces that can be electrically connected to first die 102 and second die 104 to allow for the transmission of electrical signals between first die 102 and second die 104 and/or other components (not shown). The second die 104 and the FOD layer 106 may be disposed between the substrate 110 and the first die 102. The first die 102 and the second die 104 may be electrically connected to the substrate 110. In some embodiments, the semiconductor assembly 100 includes one or more bond wires 112 embedded in the first portion 106a of the FOD layer 106. The one or more bond wires 112 may electrically connect the second die 104 to the substrate 110. In some embodiments, first die 102 may also be electrically connected to substrate 110 by a separate set of bond wires (not shown).

In some embodiments, second die 104 may have smaller dimensions than first die 102 such that second die 104 may have a smaller footprint size compared to first die 102. In some non-limiting examples, the size of the first die 102 (e.g., NAND die) may be around 6266×12175 micrometers (μm), and the size of the second die 104 (e.g., controller die) may be around 2089.569×3798.944 μm. First die 102 and second die 104 may have other dimensions according to other embodiments.

Referring to FIG. 1B, there is shown a top-view of a FOD layer 106 for the semiconductor assembly 100 of FIG. 1A. As shown, in some embodiments, the FOD layer 106 includes a first portion 106a and a second portion 106b. In some embodiments, the first portion 106a has a square or rectangular shape, though other shapes are also possible according to other embodiments. In some embodiments, the size of the first portion 106a should be at least sufficient to totally cover the second die 104 and the bond wires 112. Thus, the second die 104 may be entirely embedded in the first portion 106a of the FOD layer 106. Also, the one or more bond wires 112 may be entirely embedded in the first portion 106a of the FOD layer 106. In some embodiments, first portion 106a may have dimensions that are at least 1000 μm greater than the dimensions of second die 104. In one non-limiting example, second die 104 (e.g., controller die) may be around 2089.569 μm×3798.944 μm and first portion 106a may be at least 3089.569 μm×4798.944 μm. In some embodiments, as shown in FIG. 1B, the first portion 106a may be a central portion of the FOD layer 106 that is surrounded by the second portion 106b.

Figure 2:
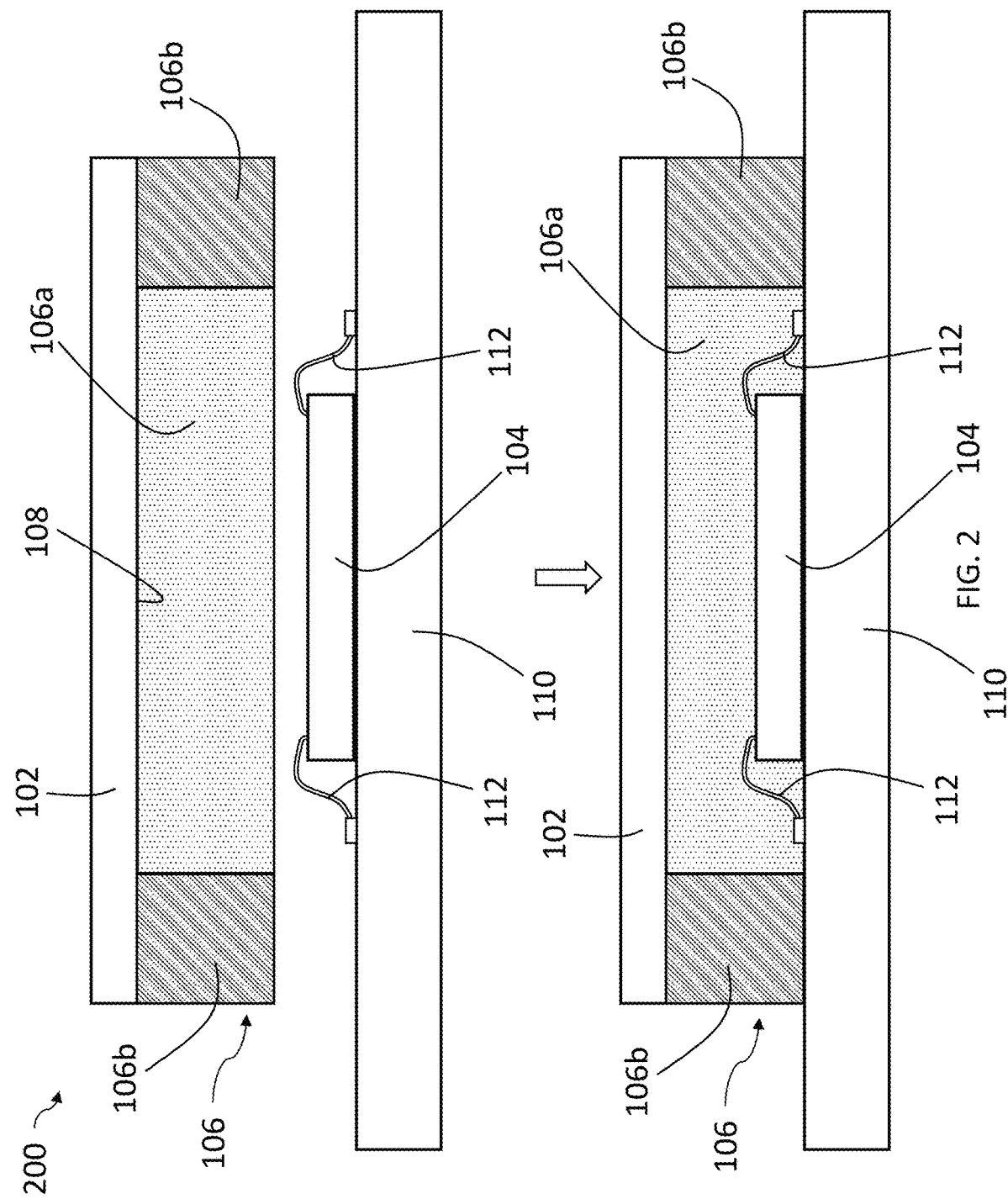
FIG. 2 illustrates a die attach process of embedding a controller die into a semiconductor assembly according to some embodiments.

Referring to FIG. 2, there is shown a die attach process 200 of embedding a controller die (e.g., the second die 104) into a semiconductor assembly (e.g., the semiconductor assembly 100). FOD layer 106, including first portion 106a and second portion 106b, is disposed on first surface 108 of first die 102. As shown, in some embodiments, before die attachment, the controller die 104 with bonding wires 112 are mounted on the substrate 110, and not embedded in the first portion 106a of the semiconductor assembly 100. After the die attachment process, the second die 104 with bonding wires 112 can be embedded in the first portion 106a of the semiconductor assembly 100, and a curing process may be used to harden the cure-type DAF of first portion 106a with second die 104 and bonding wires 112 embedded therein. Further bonding wires or other conductive elements (not shown) may be used to electrically connect first die 102 to substrate 110. In one example, the first portion 106a may be used to embed the controller die 104 and bonding wires 112. The second portion 106b may provide mechanical support and prevent the cure-type DAF material of first portion 106a from bleeding. In some embodiments, the material cost of the first portion 106a may be higher than the material cost of the second portion 106b. To reduce material cost, the second portion 106b may be designed as large as possible. On the other hand, the first portion 106a may be designed as small as needed. For example, as described above, the first portion 106a may be designed to have dimensions that are 1000 μm greater than the dimensions of second die 104, such as 3089.569 μm×4798.944 μm.

Figure 3:
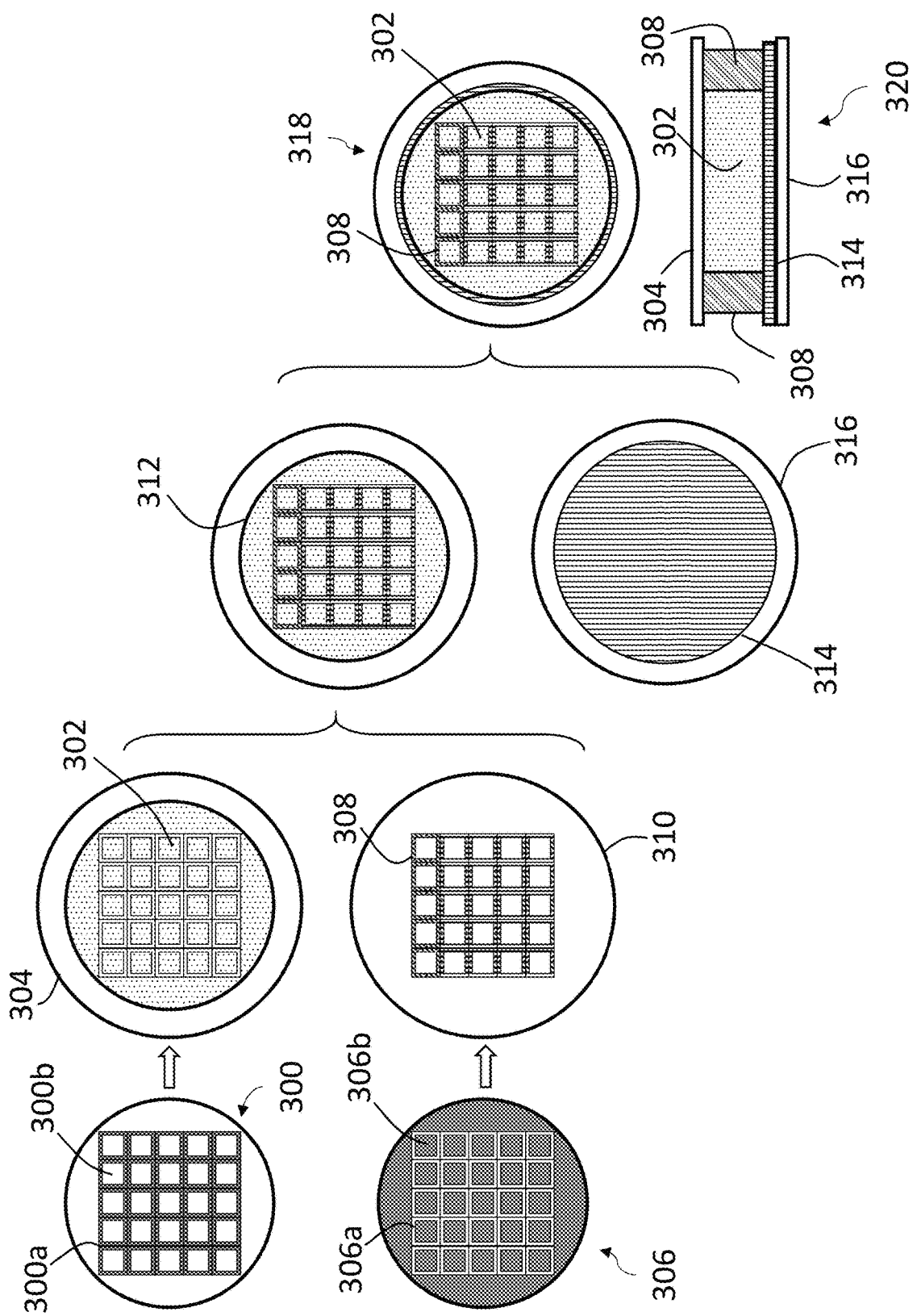
FIG. 3 illustrates a method for manufacturing a FOD layer in the semiconductor assembly of FIG. 1A.

Referring to FIG. 3, there is shown a method for manufacturing a FOD layer, e.g., the FOD layer 106, in the semiconductor assembly 100 of FIG. 1A. In some embodiments, the method includes forming a first portion of the FOD, e.g., the first portion 106a, using a first mask 300. The first mask 300 may be a mask used in photolithography. In some embodiments, the part 300a of the first mask 300 may be solid, and the part 300b of the first mask 300 may be hollow. In some embodiments, the first mask 300 may indicate a size and shape of the first portion of the FOD. For example, the solid part 300a and the hollow part 300b may indicate the size and shape of the first portion of the FOD, e.g., the first portion 106a.

In some embodiments, as shown in FIG. 3, the first mask 300 is applied to a DAF 302 including a first type of DAF, e.g., the cure type of DAF. Applying the first mask 300 to the DAF 302 may be similar as applying a mask in photolithography. In some embodiments, the DAF 302 is disposed on a liner 304. Thus, in these embodiments, the first portion of the FOD, e.g., the first portion 106a including the curetype of DAF, is formed on the liner 304.

Similarly, in some embodiments, the method includes forming a second portion of the FOD, e.g., the second portion 106b, using a second mask 306. The second mask 306 may be a mask used in photolithography. In some embodiments, the part 306a of the second mask 306 may be hollow, and the part 306b of the second mask 306 may be solid. In some embodiments, the second mask 306 may indicate a size and shape of the second portion of the FOD. For example, the hollow part 306a and the solid part 306b may indicate the size and shape of the second portion of the FOD, e.g., the second portion 106b.

In some embodiments, as shown in FIG. 3, the second mask 306 is applied to a DAF 308 including a second type of DAF, e.g., a non-cure type of DAF. Applying the second mask 306 to the DAF 308 may be similar as applying a mask in photolithography. In some embodiments, the DAF 308 is disposed on another liner 310. Thus, in these embodiments, the second portion of the FOD, e.g., the second portion 106b including the non-cure type of DAF, is formed on the liner 310.

In some embodiments, the first portion of the FOD formed on the liner 304, and the second portion of the FOD formed on the liner 310, may be assembled to form the FOD, such that the first portion is surrounded by the second portion. For example, the first portion of the FOD formed on the liner 304, and the second portion of the FOD formed on the liner 310, may be punched together to form the hybrid FOD 312. In one example, to align the first portion of the FOD formed on the liner 304 and the second portion of the FOD formed on the liner 310, fiducial marks may be designed on the first portion and second portion of the FOD. Using the fiducial marks, the first portion and second portion of the FOD can be aligned when punched together.

In some embodiments, a dicing tape 314 may be attached on a liner 316. The dicing tape 314 may support DAF functions implemented during die preparation process and die attach process. In some embodiments, the method also includes attaching the dicing tape to a top or bottom surface of the FOD. For example, as shown in FIG. 3, the formed hybrid FOD 312 and the dicing tape 314 attached on the liner 316 may be punched together to form the final hybrid FOD 318, which is from a top view. The final hybrid FOD 320 is from a partial cross-sectional view. As can be seen, the dicing tape 314 is attached on the bottom surface of the FOD.

Embodiments of the disclosure herein provide a hybrid FOD (e.g, the FOD layer 106). The hybrid FOD is not a uniform structure. The edge area (e.g., the second portion 106b) of the hybrid FOD may be a non-cure type DAF, which has a relatively high modulus and may not bleed out during die attach. On the other hand, the middle or central area (e.g., the first portion 106a) of the hybrid FOD may be a cure type DAF, which has good flowability during die attach.

In some embodiments, with the hybrid FOD 106, the first die 104 and bonding wires 112 may be embedded inside the first portion 106a. In some embodiments, the second portion 106b including the non-cure type DAF may work as a dam to prevent the cure type DAF in the first portion 106a from bleeding out (e.g., flowing beyond the edges of first die 102. Also, the second portion 106b including the non-cure type DAF may provide mechanical support to make the structure balanced. Because the second portion 106b including the non-cure type DAF can provide a dam effect, the first portion 106a including the cure type DAF may be compressed to embed the controller die 104 and bonding wires 112 better. Also, with the hybrid FOD 106, the surface flatness may be better. Therefore, one advantage of the present disclosure is that bleeding and die bowing during die attachment may be mitigated.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor assembly, comprising:
 a first die;
 a second die;
 a film on die (FOD) layer configured to attach the first die to the second die, the FOD layer being disposed on a first surface of the first die and comprising:
  a first portion comprising a first die attach film (DAF) disposed on an inner region of the first surface; and
  a second portion comprising a second DAF disposed on a peripheral region of the first surface surrounding the inner region, the second DAF comprising a different material than the first DAF.

2. The semiconductor assembly of claim 1, wherein the peripheral region extends from the inner region to one or more edges of the first surface.

3. The semiconductor assembly of claim 2, wherein the FOD layer does not extend beyond the edges of the first surface.

4. The semiconductor assembly of claim 1, wherein the first DAF includes a cured DAF, and the second DAF includes a non-cured DAF.

5. The semiconductor assembly of claim 1, wherein the second die is embedded in the first portion of the FOD layer.

6. The semiconductor assembly of claim 5, wherein the second die is mounted on a substrate, wherein the second die and the FOD layer are disposed between the substrate and the first die, and wherein the first die and the second die are electrically connected to the substrate.

7. The semiconductor assembly of claim 6, further comprising one or more bond wires embedded in the first portion of the FOD layer, the one or more bond wires electrically connecting the second die to the substrate.

8. The semiconductor assembly of claim 1, wherein the first die is a memory die and the second die is a controller die.

9. The semiconductor assembly of claim 8, wherein the memory die is a NAND die.

10. A method for manufacturing a film on die (FOD), comprising:
 forming a first portion of the FOD using a first mask, wherein the first portion comprises a first type of die attach film (DAF), the first mask indicating a size and shape of the first portion;
 forming a second portion of the FOD using a second mask, wherein the second portion comprises a second type of DAF, the second mask indicating a size and shape of the second portion; and
 assembling the first portion and the second portion to form the FOD, such that the first portion is surrounded by the second portion.

11. The method of claim 10, wherein the first type of DAF includes a cure type of DAF, and the second type of DAF includes a non-cure type of DAF.

12. The method of claim 10, wherein the first type of DAF does not include a non-cure type of DAF, and the second type of DAF does not include a cure type of DAF.

13. The method of claim 10, wherein forming the first portion of the FOD includes forming the first portion of the FOD on a liner, and wherein forming the second portion of the FOD includes forming the second portion of the FOD on another liner.

14. The method of claim 10, further comprising attaching a dicing tape to a top or bottom surface of the FOD.

15. The method of claim 10, wherein the first portion is a central portion of the FOD surrounded by the second portion.

16. The method of claim 10, wherein the first portion has a square or rectangular shape.

17. A semiconductor assembly, comprising:
 a first die means for storing data;
 a second die means for controlling the first die means;
 a film means for attaching the first die means to the second die means, the second die means being embedded in the film means, the film means comprising a first portion and a second portion, wherein the first portion comprises a first type of die attach film (DAF), and the second portion comprises a second type of DAF, wherein the first portion is surrounded by the second portion.

18. The semiconductor assembly of claim 17, wherein the first portion is a central portion of the film means surrounded by the second portion.

19. The semiconductor assembly of claim 17, wherein the first type of DAF includes a cure type of DAF, and the second type of DAF includes a non-cure type of DAF.

20. The semiconductor assembly of claim 17, wherein the first type of DAF does not include a non-cure type of DAF, and the second type of DAF dost not include a cure type of DAF.

* * * * *